United States Patent
Alnahhas

(10) Patent No.: US 11,699,715 B1
(45) Date of Patent: Jul. 11, 2023

(54) FLIP-CHIP MOUNTING OF OPTOELECTRONIC CHIPS

(71) Applicant: Apple Inc., Cupertino, CA (US)

(72) Inventor: Yazan Z. Alnahhas, Mountain View, CA (US)

(73) Assignee: APPLE INC., Cupertino, CA (US)

( * ) Notice: Subject to any disclaimer, the term of this patent is extended or adjusted under 35 U.S.C. 154(b) by 370 days.

(21) Appl. No.: 17/013,599

(22) Filed: Sep. 6, 2020

(51) Int. Cl.
*H01L 27/146* (2006.01)

(52) U.S. Cl.
CPC .. *H01L 27/14636* (2013.01); *H01L 27/14627* (2013.01); *H01L 27/14643* (2013.01); *H01L 27/14685* (2013.01); *H01L 27/14687* (2013.01)

(58) Field of Classification Search
CPC ......... H01L 27/14636; H01L 27/14627; H01L 27/14643; H01L 27/14685; H01L 27/14687; H01L 27/14623; H01L 27/14618; H01L 27/14625; H01L 27/146; H04N 5/225; H04N 5/369; G02B 5/22; G03B 11/00; G03B 17/02
See application file for complete search history.

(56) References Cited

U.S. PATENT DOCUMENTS

| | | | |
|---|---|---|---|
| 4,069,463 A | 1/1978 | McGroddy et al. | |
| 5,812,571 A | 9/1998 | Peters | |
| 6,156,980 A | 12/2000 | Peugh et al. | |
| 6,597,713 B2 | 7/2003 | Ouchi | |
| 6,625,028 B1 | 9/2003 | Dove et al. | |
| 6,674,948 B2 | 1/2004 | Yeh et al. | |
| 6,936,855 B1 | 8/2005 | Harrah | |
| 7,126,218 B1 | 10/2006 | Darveaux et al. | |
| 7,271,461 B2 | 9/2007 | Dutta | |

(Continued)

FOREIGN PATENT DOCUMENTS

| | | |
|---|---|---|
| CN | 205123806 U | 3/2016 |
| CN | 107219711 A | 9/2017 |

(Continued)

OTHER PUBLICATIONS

Huang et al., U.S. Appl. No. 16/502,059, filed Jul. 3, 2019.

(Continued)

*Primary Examiner* — Jonathan Han
(74) *Attorney, Agent, or Firm* — Kligler & Associates Patent Attorneys Ltd

(57) ABSTRACT

An optoelectronic assembly includes an integrated circuit (IC) chip including, on its front side, a photoconversion region and first electrical contact pads disposed alongside the photoconversion region. A circuit substrate contains a cavity into which the IC chip is inserted through the lower side and has a window opening through the upper side in communication with the cavity such that the photoconversion region of the IC chip is exposed through the window. The circuit substrate includes electrical circuit traces, which include second electrical contact pads disposed within the cavity alongside the window so as to contact the first electrical contact pads on the front side of the IC chip within the cavity. A base includes a stiff, heat-conducting material, to which the lower side of the circuit substrate is fixed. A malleable heat-conducting layer is compressed between the rear side of the IC chip and the base.

12 Claims, 2 Drawing Sheets

(56) References Cited

U.S. PATENT DOCUMENTS

| | | | |
|---|---|---|---|
| 7,303,005 B2 | 12/2007 | Reis et al. | |
| 7,800,067 B1 | 9/2010 | Rajavel et al. | |
| 7,949,024 B2 | 5/2011 | Joseph | |
| 8,050,461 B2 | 11/2011 | Shpunt et al. | |
| 8,193,482 B2 | 6/2012 | Itsler | |
| 8,259,293 B2 | 9/2012 | Andreou | |
| 8,275,270 B2 | 9/2012 | Shushakov et al. | |
| 8,350,847 B2 | 1/2013 | Shpunt | |
| 8,355,117 B2 | 1/2013 | Niclass | |
| 8,405,020 B2 | 3/2013 | Menge | |
| 8,604,603 B2 | 12/2013 | Lau et al. | |
| 8,761,495 B2 | 6/2014 | Freedman et al. | |
| 8,766,164 B2 | 7/2014 | Sanfilippo et al. | |
| 8,963,069 B2 | 2/2015 | Drader et al. | |
| 9,024,246 B2 | 5/2015 | Jiang et al. | |
| 9,052,356 B2 | 6/2015 | Chu et al. | |
| 9,076,707 B2 | 7/2015 | Harmon | |
| 9,106,849 B2 | 8/2015 | Duggal et al. | |
| 9,430,006 B1 | 8/2016 | Hayashida | |
| 9,735,539 B2 | 8/2017 | Jiang et al. | |
| 9,819,144 B2 | 11/2017 | Lin et al. | |
| 9,826,131 B2 * | 11/2017 | Alasirniö | H04N 5/2257 |
| 10,034,375 B2 | 7/2018 | Pyper et al. | |
| 10,103,512 B2 | 10/2018 | Jiang et al. | |
| 10,375,330 B2 | 8/2019 | Rephaeli et al. | |
| 10,401,480 B1 | 9/2019 | Gaalema et al. | |
| 10,454,241 B2 | 10/2019 | Jiang et al. | |
| 10,470,307 B2 | 11/2019 | Pyper et al. | |
| 10,551,886 B1 | 2/2020 | de la Fuente | |
| 11,296,136 B2 * | 4/2022 | Nagai | H01L 27/14625 |
| 2002/0070443 A1 | 6/2002 | Mu et al. | |
| 2002/0127752 A1 | 9/2002 | Thompson et al. | |
| 2002/0176459 A1 | 11/2002 | Martinsen | |
| 2003/0081385 A1 | 5/2003 | Mochizuki et al. | |
| 2004/0001317 A1 | 1/2004 | Getz, Jr. et al. | |
| 2004/0180470 A1 | 9/2004 | Romano et al. | |
| 2007/0262441 A1 | 11/2007 | Chen | |
| 2010/0164079 A1 | 7/2010 | Dekker et al. | |
| 2010/0208132 A1 * | 8/2010 | Shiraishi | H01L 31/02325 348/374 |
| 2011/0026264 A1 | 2/2011 | Reed et al. | |
| 2011/0278629 A1 | 11/2011 | McDaniel et al. | |
| 2012/0002293 A1 | 1/2012 | Du et al. | |
| 2012/0051384 A1 | 3/2012 | Geske et al. | |
| 2013/0015331 A1 | 1/2013 | Birk et al. | |
| 2013/0163627 A1 | 6/2013 | Seurin | |
| 2013/0342835 A1 | 12/2013 | Blaksberg | |
| 2014/0231630 A1 | 8/2014 | Rae et al. | |
| 2014/0348192 A1 | 11/2014 | Prujimboom et al. | |
| 2014/0353471 A1 | 12/2014 | Raynor et al. | |
| 2015/0092802 A1 | 4/2015 | Gronenborn et al. | |
| 2015/0163429 A1 | 6/2015 | Dai et al. | |
| 2015/0195956 A1 | 7/2015 | Linderman | |
| 2015/0200222 A1 | 7/2015 | Webster | |
| 2015/0200314 A1 | 7/2015 | Webster | |
| 2015/0255955 A1 | 9/2015 | Wang et al. | |
| 2015/0340841 A1 | 11/2015 | Joseph | |
| 2015/0342023 A1 | 11/2015 | Refai-Ahmed et al. | |
| 2015/0348865 A1 | 12/2015 | Vincent et al. | |
| 2016/0300825 A1 | 10/2016 | Hoeppel | |
| 2017/0170219 A1 * | 6/2017 | Iwafuchi | H01L 27/14627 |
| 2018/0092241 A1 | 3/2018 | Rasmussen et al. | |
| 2018/0092253 A1 | 3/2018 | Qiu et al. | |
| 2018/0239105 A1 | 8/2018 | Lee et al. | |
| 2018/0310407 A1 | 10/2018 | Pyper et al. | |
| 2019/0129035 A1 | 5/2019 | Valouch et al. | |
| 2019/0264890 A1 | 8/2019 | Chang et al. | |
| 2019/0268068 A1 | 8/2019 | Dacha et al. | |
| 2019/0295264 A1 * | 9/2019 | Petilli | G06T 7/285 |
| 2019/0324223 A1 | 10/2019 | Yim et al. | |
| 2019/0326731 A1 | 10/2019 | Mathai et al. | |
| 2019/0381939 A1 | 12/2019 | Rafalowski et al. | |
| 2020/0096639 A1 | 3/2020 | Panas et al. | |
| 2020/0388640 A1 * | 12/2020 | Yu | H01L 27/14618 |

FOREIGN PATENT DOCUMENTS

| | | |
|---|---|---|
| CN | 110867724 A | 3/2020 |
| CN | 210224593 U | 3/2020 |
| EP | 0949728 A1 | 10/1999 |
| WO | 2018132521 A1 | 7/2018 |
| WO | 2019149778 A1 | 8/2019 |
| WO | 2020026616 A1 | 2/2020 |
| WO | 2020039086 A1 | 2/2020 |
| WO | 2020074351 A1 | 4/2020 |

OTHER PUBLICATIONS

U.S. Appl. No. 16/502,059 Office Action dated Jul. 10, 2020.
EP Application # 21169425.2 Search Report dated Sep. 24, 2021.
IN Application # 202114022832 Office Action dated Feb. 24, 2022.
U.S. Appl. No. 17/223,047 Office Action dated Jan. 26, 2023.

* cited by examiner

FLIP-CHIP MOUNTING OF OPTOELECTRONIC CHIPS

FIELD OF THE INVENTION

The present invention relates generally to electronic devices, and particularly to apparatus and methods for mounting of integrated circuit chips.

BACKGROUND

"Flip-chip" is a technology used in connecting semiconductor devices, such as integrated circuit (IC) chips, to external circuitry. To prepare for flip-chip mounting, solder bumps are deposited onto contact pads on the top (front) side of the semiconductor wafer during the final wafer processing steps. The wafer is then diced to create individual IC chips. In order to mount a chip on a circuit substrate, the chip is flipped over so that its front side faces down, and is aligned so that its contact pads align with matching pads on the circuit substrate. The solder is then reflowed to complete the interconnect.

This face-down mounting of flip-chip ICs is in contrast to wire bonding, in which the chip is mounted face-up, and wires are used to interconnect the chip pads to contacts on the substrate. Flip-chip mounting is advantageous in enabling rapid, mechanized assembly of chips to a substrate. The resulting assemblies are generally much more compact than traditional wire-bonded assemblies, and the flip-chip contact bonds have much lower inductance than bonding wires.

SUMMARY

Embodiments of the present invention that are described hereinbelow provide improved electronic assemblies, as well as methods for producing such assemblies.

There is therefore provided, in accordance with an embodiment of the invention, an optoelectronic assembly, including an integrated circuit (IC) chip having front and rear sides, and including, on the front side, a photoconversion region and first electrical contact pads disposed alongside the photoconversion region. A circuit substrate having upper and lower sides contains a cavity into which the IC chip is inserted through the lower side and has a window opening through the upper side in communication with the cavity such that the photoconversion region of the IC chip is exposed through the window. The circuit substrate includes electrical circuit traces, which include second electrical contact pads disposed within the cavity alongside the window so as to contact the first electrical contact pads on the front side of the IC chip within the cavity. A base includes a stiff, heat-conducting material, to which the lower side of the circuit substrate is fixed. A malleable heat-conducting layer is compressed between the rear side of the IC chip and the base.

In a disclosed embodiment, the IC chip includes an image sensor, and the photoconversion region includes a photodetector array. In one embodiment, a lens is mounted over the circuit substrate and configured to form an optical image on the photodetector array, and an optical filter is mounted over the window in the circuit substrate.

Additionally or alternatively, one or more electronic components are mounted on the upper side of the circuit substrate in contact with the electrical circuit traces. In one embodiment, a printed circuit is overlaid on the base and includes electrical connections that make contact with the electrical circuit traces on the circuit substrate.

Typically, the IC chip has a thickness between the front and rear sides of at least 0.2 mm. The thickness of the IC chip may at least 0.5 mm. Alternatively or additionally, the thickness of the IC chip is within ±0.1 mm of a depth of the cavity in the circuit substrate.

In some embodiments, the heat-conducting layer includes a thermal adhesive, a thermal gel, and/or a thermal pad.

There is also provided, in accordance with an embodiment of the invention, a method for manufacturing, which includes providing an integrated circuit (IC) chip having front and rear sides, and including, on the front side, a photoconversion region and first electrical contact pads disposed alongside the photoconversion region. A cavity is formed in a lower side of a side of a circuit substrate with a shape and size suitable to receive the IC chip. A window is opened through the upper side of the circuit substrate in communication with the cavity. Electrical circuit traces are formed on the circuit substrate, including second electrical contact pads disposed within the cavity alongside the window. The IC chip is inserted into the cavity so that the photoconversion region of the IC chip is exposed through the window, and the first electrical contact pads on the front side of the IC chip contact the second electrical contact pads within the cavity. A malleable heat-conducting layer is applied to the rear side of the IC chip. The circuit substrate is fixed to a base including a stiff, heat-conducting material, such that the base contacts and compresses the malleable heat-conducting layer.

The present invention will be more fully understood from the following detailed description of the embodiments thereof, taken together with the drawings in which:

DETAILED DESCRIPTION OF EMBODIMENTS

Figure 1:
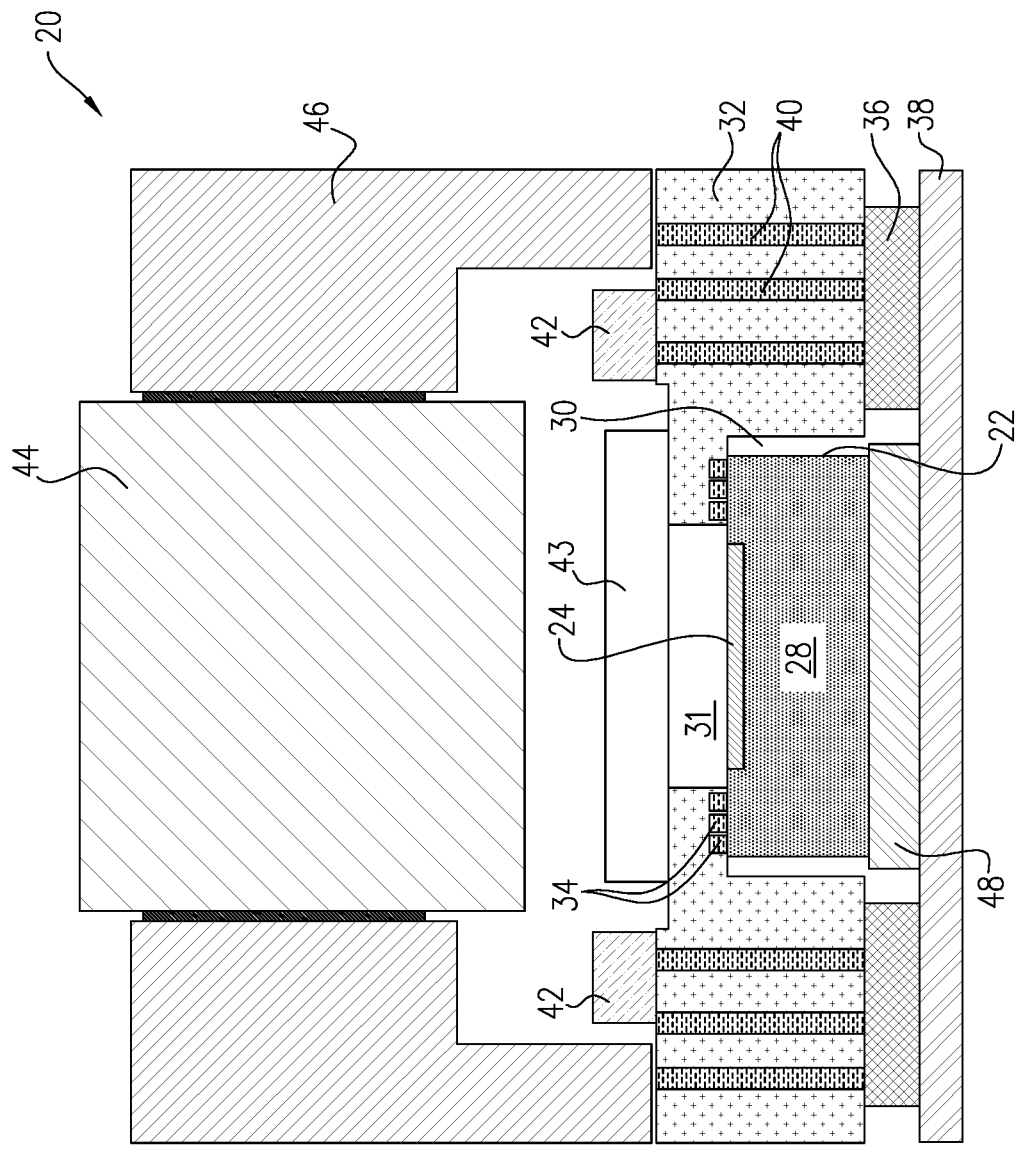
FIG. 1 is schematic sectional view of an optoelectronic assembly, in accordance with an embodiment of the invention.

In conventional flip-chip ICs, the rear side of the silicon die is thinned, typically to a thickness of 0.1 mm or less. Heat generated in operation of the IC is transferred from the front side of the die to the circuit substrate on which the IC is mounted, thus reducing the operating temperature of the IC. Thinning the die in this manner can be beneficial in reducing thermal resistance, improving device performance and reliability, lowering overall package height, and minimizing die stress due to mismatches in the coefficient of thermal expansion between the silicon die and the substrate.

For optoelectronic flip-chip ICs, however, this mechanism of heat removal from the front side of the die to the circuit substrate may not be sufficiently effective. Such chips comprise, on their front side, a photoconversion region, such as an array of photodetectors, which convert incoming light into electrical currents. The electrical contact pads for flip-chip mounting are disposed alongside the photoconversion region on the front side of the IC chip.

The IC is typically mounted in a cavity in the lower side of a circuit substrate, with the front side of the IC facing into the cavity. For the photoconversion region to operate as intended, however, it must not be covered by the circuit substrate. Therefore, a window opens through the upper side of the substrate, in communication with the cavity, so that the photoconversion region of the IC chip is exposed through the window. The substrate contains electrical contact pads within the cavity alongside the window, arranged so as to contact the electrical contact pads on the front side of the IC chip when the chip is mounted in the cavity.

Thus, in contrast to a conventional flip-chip IC, in which the entire front side of the die is available to contact the circuit substrate, in an optoelectronic flip-chip IC the part of the front side that is in contact with the circuit substrate may be limited to the area of the electrical contact array. (The photoconversion region is exposed through the window, as noted above.) Because of this limitation, thermal transfer from the IC die to the circuit substrate is typically reduced by 50% or more relative to conventional flip-chip ICs. Other heat transfer mechanisms, such as convection of heat from the rear side of the die, are far less effective. As a result, optoelectronic flip-chip ICs are prone to overheating.

Embodiments of the present invention that are described herein address this problem by enabling conductive heat transfer from the rear side of the optoelectronic IC chip to a base to which the lower side of the circuit substrate is fixed. This base typically comprises a stiff, heat-conducting material. To facilitate heat transfer from the rear side of the IC chip to the base, a malleable heat-conducting layer, such as a thermal adhesive, gel or pad, is compressed between the rear side of the IC chip and the base. The additional conductive heat transfer path provided by this malleable heat-conducting layer can substantially reduce the operating temperature of the IC chip.

In the context of the present description and in the claims, the term "heat-conducting" refers to materials having thermal conductivity of at least 1 watt/meter-kelvin, i.e., k≥1 W/m·K. The term "malleable" means that the heat-conducting layer is substantially softer than the stiff base and IC chip, so that compression of the heat-conducting layer between the chip and the base reduces the thickness of the layer by at least 10% relative to its initial, uncompressed thickness. This malleability is beneficial in both creating a good thermal contact between the chip and the base and in providing a cushion to protect the chip against mechanical shocks and strains. The terms "front," "rear," "upper" and "lower" are used arbitrarily, for the sake of clarity in distinguishing between the sides of the IC chip and the substrate, and do not require that the chip and substrate be held in any particular orientation during the assembly process or in subsequent operation of the assembly.

For good heat conduction between the IC chip and the base, it is generally desirable that the malleable heat-conducting layer be relatively thin. To satisfy this objective, the rear side of the IC chip should be approximately flush with the lower side of the substrate when the IC chip is mounted in the cavity in the circuit substrate. For this purpose, in some embodiments, the thickness of the IC chip is within ±0.1 mm of the depth of the cavity. In practical terms, to satisfy this criterion, the rear side of the semiconductor substrate of the chip should be thinned to a lesser degree than in conventional flip-chip ICs, and possibly not thinned at all. Thus, in some embodiments, the thickness of the optoelectronic flip-chip IC is at least 0.2 mm and may be even 0.5 mm or more.

Figure 2:
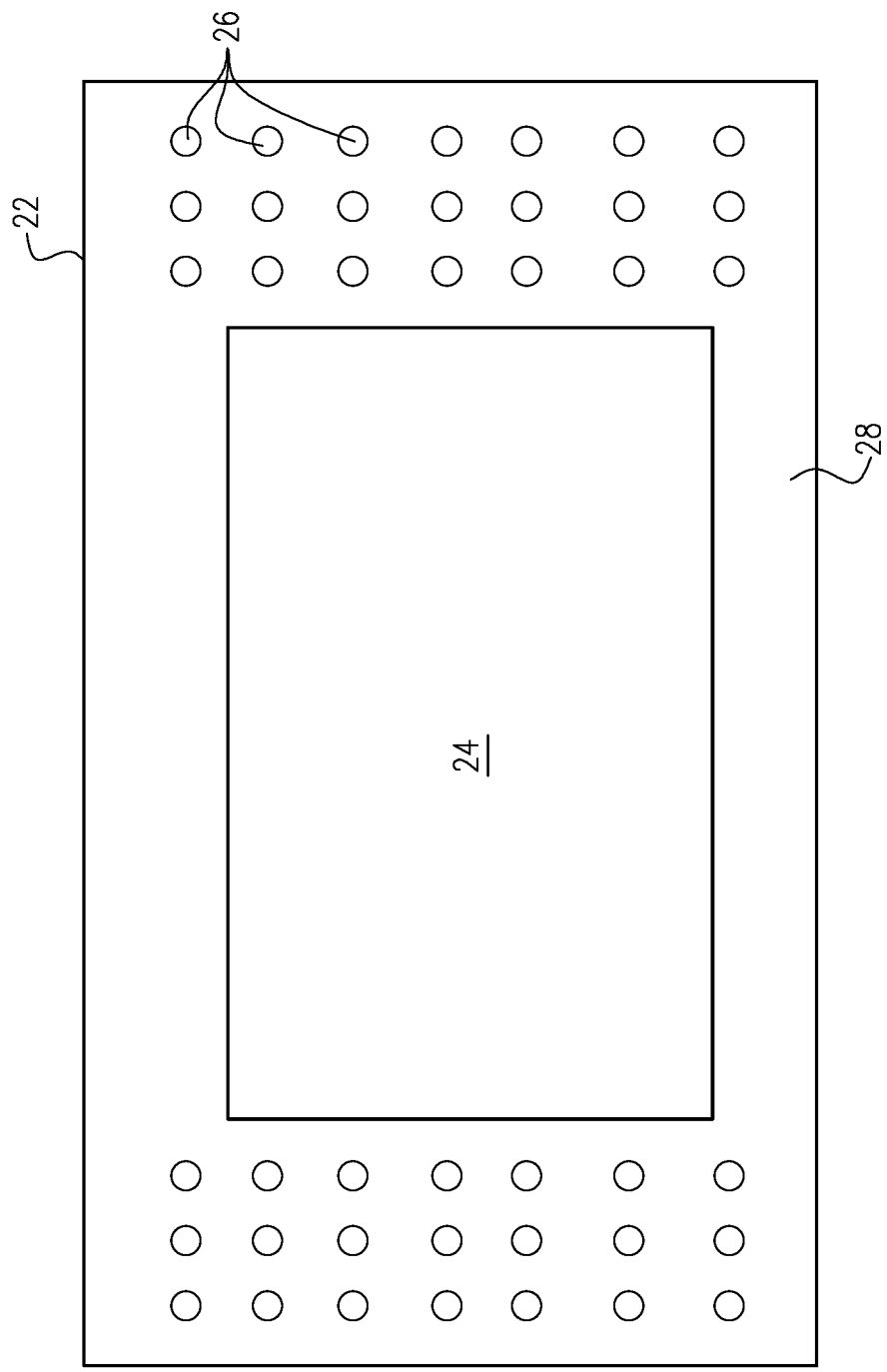
FIG. 2 is a schematic frontal view of an image sensor in the assembly of FIG. 1.

Reference is now made to FIGS. 1 and 2, which schematically illustrate an optoelectronic assembly 20, in accordance with an embodiment of the invention. FIG. 1 is sectional view of assembly 20, while FIG. 2 is a schematic frontal view of a flip-chip image sensor chip 22 in assembly 20.

Image sensor chip 22 comprises a semiconductor substrate 28, such as a silicon die, with a photoconversion region 24 formed on the front side of the chip, typically using processes of thin-film deposition and processing that are known in the art. In an example embodiment, photoconversion region 24 comprises an array of photodetectors, such as photodiodes, together with suitable charge storage and readout circuits. Alternatively, photoconversion region 24 may comprise other sorts of materials and circuits for receiving light, or both. (The term "light," as used in the context of the present description, refers to electromagnetic radiation in any of the visible, infrared and ultraviolet ranges.) Electrical contact pads 26 are disposed alongside photoconversion region 24 on the front side of chip 22.

Chip 22 is inserted through the lower side of a circuit substrate 32 into a cavity 30 within the circuit substrate. Circuit substrate 32 typically comprises a suitable dielectric material, such as a ceramic material. Electrical circuit traces are formed on and in circuit substrate 32, such as vias 40 passing between the upper and lower sides of the substrate and electrical contact pads 34 within cavity 30. Contact pads 34 are disposed in an array alongside a window 31 that opens between cavity 30 and the upper side of the circuit substrate. Thus, when chip 22 is inserted into cavity 30, photoconversion region 24 is exposed through window 31, and contact pads 24 on chip 22 (FIG. 2) make electrical contact with contact pads 34. As noted earlier, semiconductor substrate 28 can be relatively thick, for example with a thickness of at least 0.2 mm, or even at least 0.5 mm, between the front and rear sides. Thus, the rear side of chip 22 is roughly flush with the lower side of circuit substrate 32 and may even protrude slightly beyond the lower side of the circuit substrate.

The components of assembly 20 are mounted on a base 38, comprising a stiff, heat-conducting material, such as a suitable metal or ceramic. In the pictured embodiment, a printed circuit 36, such as a flexible printed circuit board, is overlaid on base 38. Printed circuit 36 comprises electrical connections (not shown), which make contact with the electrical circuit traces on circuit substrate 32, for example with the lower ends of vias 40. One or more other electronic components 42, such as active or passive components supporting the operation of image sensor 22, can be mounted on the upper side of circuit substrate 32, in contact with the electrical circuit traces on or in substrate 32, such as vias 40.

To enable image sensor chip 22 to capture images, a lens 44 is mounted in a lens holder over circuit substrate 32 and forms optical images on the photodetector array in photoconversion region 24. An optical filter 43, for example an infrared-blocking filter, is mounted over window 31. Alternatively, the assembly may comprise other arrangements of imaging or projection optics, depending upon the purposes of the assembly and the functionality of the optoelectronic chip in the assembly.

A malleable heat-conducting layer 48 is applied between the rear side of chip 22 and base 38, so that layer 48 is compressed between the chip and the base as the parts of assembly 20 are fastened together. As noted earlier, compression of layer 48 produces a firm, flexible thermal and mechanical bond between chip 22 and base 38. Layer 48 may comprise any suitable sort of malleable, heat-conducting material, such as a thermal adhesive, thermal gel or thermal pad, or it may comprise a combination of malleable and heat-conducting materials, such as a polymer foam wrapped in a graphite sheet. Alternative implementations will be apparent to those skilled in the art and are considered to be within the scope of the present invention.

The use of malleable heat-conducting layer 48 can also make the effective thermal mass of assembly 20 much larger if the malleable heat-conducting material is part of a larger body of material or is connected through base 38 to another heat reservoir (not shown), for example in a portable electronic device. This increased thermal mass is beneficial in both short- and long-term use, as it reduces the steady-state temperature of assembly 20.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic assembly, comprising:
   an integrated circuit (IC) chip having front and rear sides, and comprising, on the front side, a photoconversion region and first electrical contact pads disposed alongside the photoconversion region;
   a circuit substrate having upper and lower sides, and containing a cavity into which the IC chip is inserted through the lower side and having a window opening through the upper side in communication with the cavity such that the photoconversion region of the IC chip is exposed through the window, the circuit substrate comprising electrical circuit traces, which comprise second electrical contact pads disposed within the cavity alongside the window so as to contact the first electrical contact pads on the front side of the IC chip within the cavity;
   a base comprising a stiff, heat-conducting material, to which the lower side of the circuit substrate is fixed; and
   a malleable heat-conducting layer, which has a thermal conductivity of at least 1 watt/meter-kelvin and is compressed between the rear side of the IC chip and the base such that compression of the heat-conducting layer between the chip and the base reduces a thickness of the heat-conducting layer by at least 10% relative to an initial, uncompressed thickness of the heat-conducting layer.

2. The assembly according to claim 1, wherein the IC chip comprises an image sensor, and the photoconversion region comprises a photodetector array.

3. The assembly according to claim 2, and comprising a lens mounted over the circuit substrate and configured to form an optical image on the photodetector array.

4. The assembly according to claim 3, and comprising an optical filter mounted over the window in the circuit substrate.

5. The assembly according to claim 1, and comprising one or more electronic components mounted on the upper side of the circuit substrate in contact with the electrical circuit traces.

6. The assembly according to claim 1, and comprising a printed circuit, which is overlaid on the base and comprises electrical connections that make contact with the electrical circuit traces on the circuit substrate.

7. The assembly according to claim 1, wherein the IC chip has a thickness between the front and rear sides of at least 0.2 mm.

8. The assembly according to claim 7, wherein the thickness of the IC chip is at least 0.5 mm.

9. The assembly according to claim 7, wherein the thickness of the IC chip is within ±0.1 mm of a depth of the cavity in the circuit substrate.

10. The assembly according to claim 1, wherein the heat-conducting layer comprises a thermal adhesive.

11. The assembly according to claim 1, wherein the heat-conducting layer comprises a thermal gel.

12. The assembly according to claim 1, wherein the heat-conducting layer comprises a thermal pad.

* * * * *